United States Patent [19]

Zimmer

[11] Patent Number: 4,891,496

[45] Date of Patent: Jan. 2, 1990

[54] HEATED TOOL WITH MULTIPLE HEATING SURFACES

[75] Inventor: Gero Zimmer, Munich, Fed. Rep. of Germany

[73] Assignee: Productech Reflow Solder Equipment Inc., Rolling Hills Estates, Calif.

[21] Appl. No.: 215,630

[22] Filed: Jul. 6, 1988

[30] Foreign Application Priority Data

Jul. 9, 1987 [DE] Fed. Rep. of Germany ....... 3722729

[51] Int. Cl.⁴ .......................... B23K 3/00; B23K 35/12
[52] U.S. Cl. ................................. 219/233; 219/85.12; 219/85.16
[58] Field of Search ................ 219/85 BA, 85 D, 233, 219/235, 228, 229, 243, 85.12, 85.16; 156/583.1, 583.2, 583.4; 228/178, 179, 180.1, 44.7; 29/837, 839, 840, 843

[56] References Cited

U.S. PATENT DOCUMENTS 3,648,354 3/1972 Mashino et al. ..................... 228/179
4,431,474 2/1984 Gronek et al. ....................... 219/243

FOREIGN PATENT DOCUMENTS 121064 6/1985 Japan ................................. 228/180.1

OTHER PUBLICATIONS

"Individually Controllable Wire Solder Reflow Bonding Tip", by Baldwin et al., *IBM Technical Disclosure Bulletin*, p. 3984, vol. 18, No. 12, May 1976.

*Primary Examiner*—A. D. Pellinen
*Assistant Examiner*—Geoffrey S. Evans
*Attorney, Agent, or Firm*—Notaro & Michalos

[57] ABSTRACT

A heating tool for soldering or otherwise heat treating first and second objects, comprises a first heating surface which is engaged against one of the objects and a second heating surface which is engaged against the other object. The first and second heating surfaces are offset from each other to accommodate the width of the first object.

15 Claims, 5 Drawing Sheets

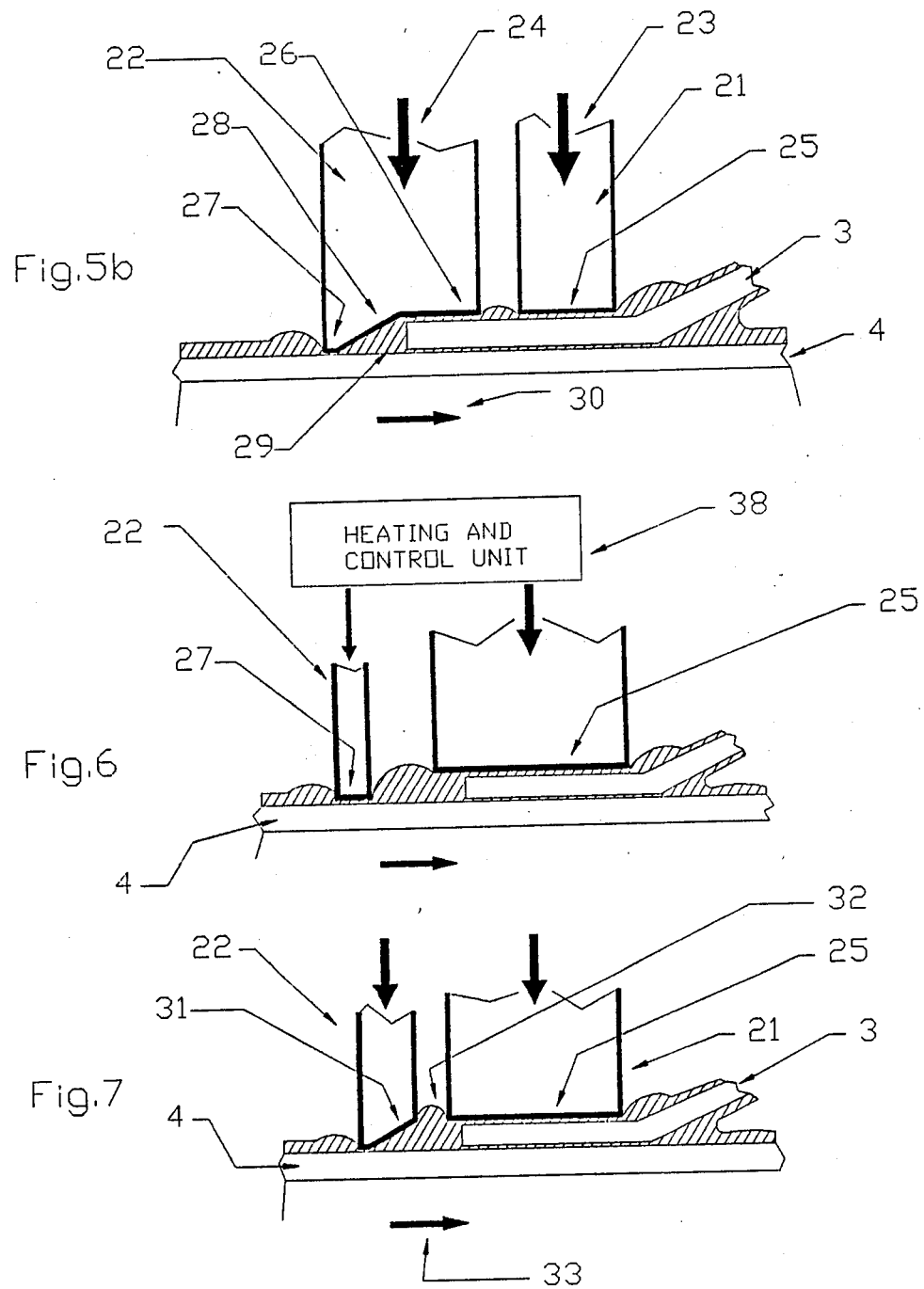

HEATED TOOL WITH MULTIPLE HEATING SURFACES

FIELD AND BACKGROUND OF THE INVENTION

The present invention relates in general to heating tools for thermally treating objects and/or for connecting objects together by welding, soldering, or gluing. The heating tools may either be moved to the objects to be treated or mounted in a fixed position, with the objects to be treated being brought to the heated tool.

Thermal energy is either supplied to the objects to be treated (e.g. to connect them to each other), by radiant heating from heated surfaces of the tool, or by direct thermal contact between the heated tool and the object. A controlled force is usually applied against the object by the heated tool. An additional thermal conductive material may be used to increase heat flow from the heated tool to the object. Flux, for example, may be provided for increasing the transfer of heat and for reducing oxidation during the thermal process.

Such tools may supply heat either continuously or during selected time periods only. Heat may be applied during heating pulses which may be activated or controlled by various external conditions, for example, by forcing the heated tool against the object to be heated or connected.

Various sources of heat are known for heating the heated tool to a variety of selected temperatures. Hot gases and/or electric current for example may be used for heating specified heat supplying areas or surfaces of the tool.

For the present invention, it is preferable to utilize the flow of electrical current through a heated tool for heating the tool. This permits controlled pulse-heating featuring fast heating rates as well as precise temperature control at various areas of the tool.

A known generally U-shaped heated tool is disclosed in German Pat. reference No. 2,848,519. This heated tool is mounted to holders either using screws or by welding. This keeps the heat supplying areas of the tool in position and further is used to provide electrical connectors for feeding electrical heating current to the tool. Such tools can be manufactured using sheet metal designs (see German Pat. Nos. 3,144,048.7, 3,137,859.5 and 3,137,860.9 to the present inventor). These heated tools can also be machined from solid materials.

When transferring thermal energy to one or more objects using one or more heated tools, excess heat and relatively long periods of time are sometimes needed, particularly when the objects are made of materials having high thermal loads.

The use of force-controlled thermal contact for transferring thermal energy from a tool to a part must also be accurately controlled. For this reason force-controlled thermal contact has limited applications. Objects having high thermal conductivity, for example objects made of metal oxides, require different procedures. Continuous preheating for example may be necessary for such applications. A heating tool is simply set at a much higher temperature to compensate for thermal loads. This has limitation however in that excess heat may be damaging to some materials.

FIG. 1 illustrates a typical configuration for connecting a first object 3, in this case a ribbon or wire extending from an electronic component 6, to a second object 4 in this case a metallization layer on a substrate. To this end, a heated tool 101 is applied with a force in the direction of arrow 2 against the first object 3 to heat it and press it against the second object 4. The force and heat of the heated tool 101 is intended to melt a solder coating 7 on the first object 3 as well as a solder coating 8 on the second object 4 in order to melt the solders and connect the objects to each other. The intention is to utilize force in the direction of arrow 2 to simultaneously melt solders 7 and 8 to join the object.

This process becomes more critical and difficult however if substrate 5 is made of material having a high thermal load. The temperature at object 4 will lose heat through substrate 5 and therefore be cooler than heated tool 101. The wire or ribbon 3 represents an additional thermal resistance between heated tool 101 and object 4. In order to melt the solder 8 below the object 3 therefore heated tool 101 must be brought to a much higher temperature. This increases the chances of damaging sensitive nearby parts, such as the electronic component 6. This also requires excessive heat and time to make the connection.

SUMMARY OF THE INVENTION

An object of the present invention is to increase the transfer of thermal energy from one or more heated tools to one or more objects to be treated or connected using heat. This is particularly true for objects representing high thermal loads.

A further object of the present invention is to provide a heating tool having a first heating surface for engaging and heating a first object and a second heating surface which is offset from the first heating surface, for simultaneously engaging and heating a second object. The distance of offset between the first and second heating surfaces is advantageously selected to be at least as great as the width of the first object. A gap or separation may advantageously be provided between the first and second heating surfaces. The heating tool may be made as a one part or multi-part structure.

A further object of the present invention is to provide a heating tool which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which the preferred embodiments of the invention are illustrated.

BRIEF DESCRIPTION OF THE DRAWINGS

Figure 1:
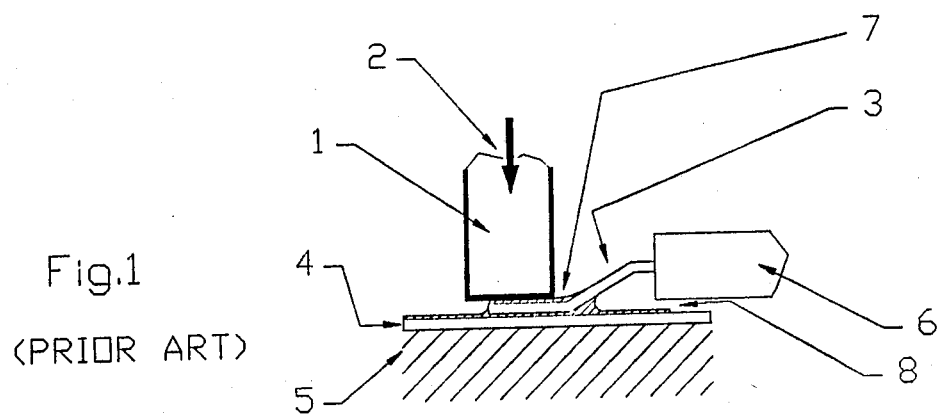
Figure 2:
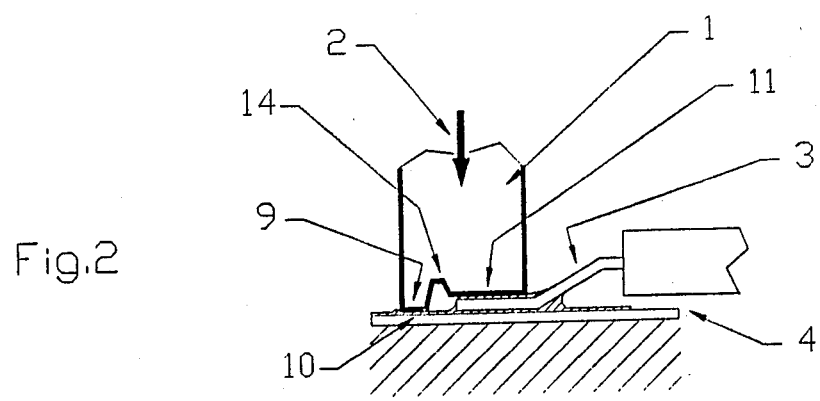
Figure 3:
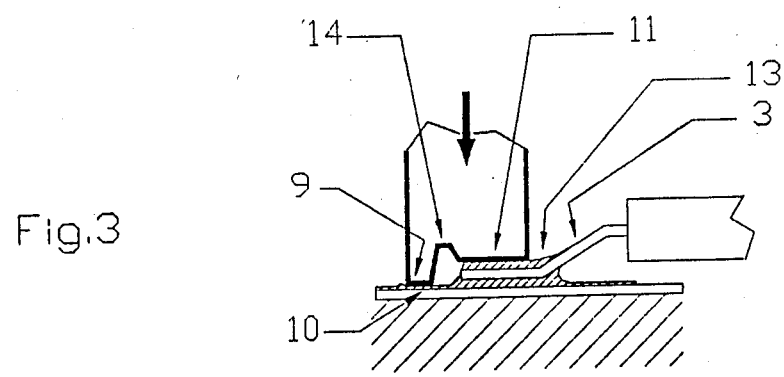
Figure 4:
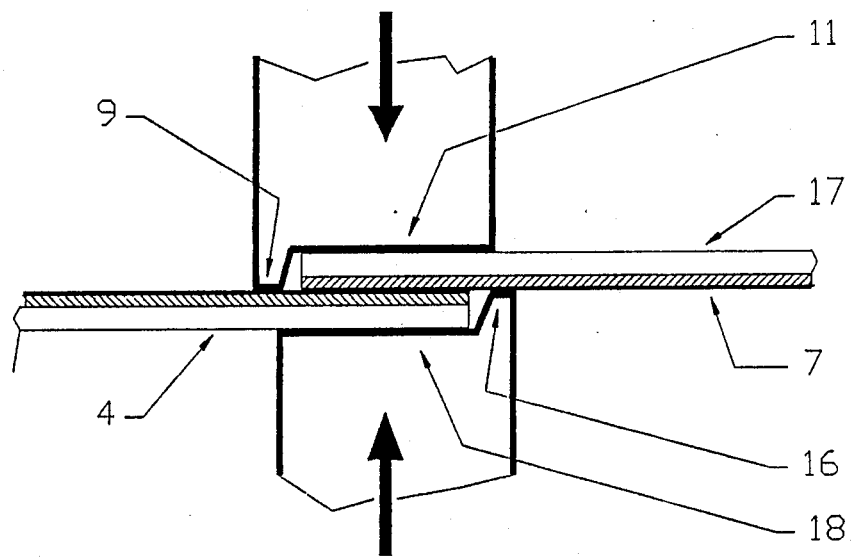
Figure 5A:
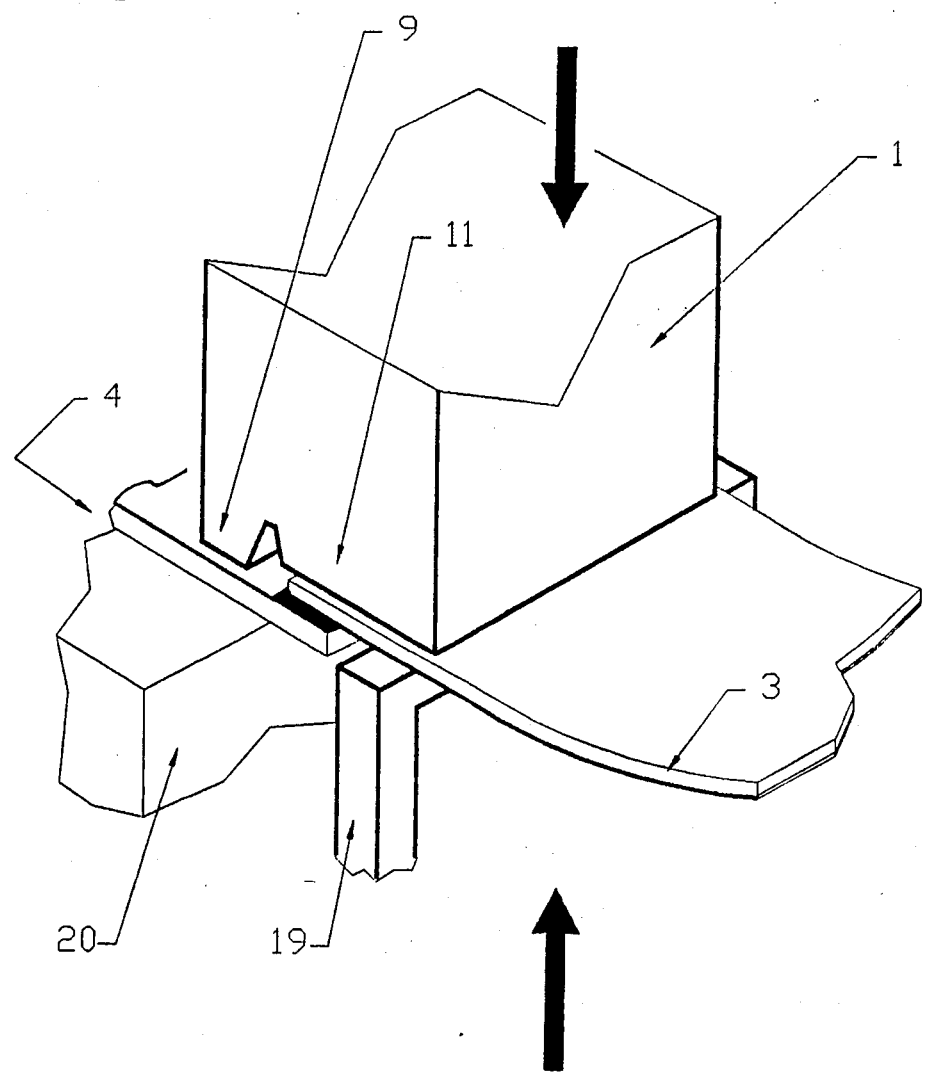
Figure 8:
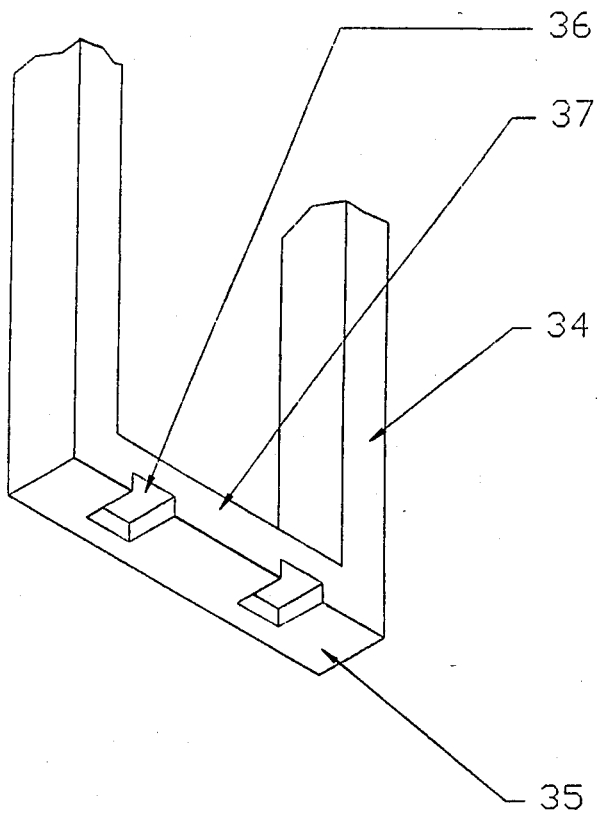

IN THE DRAWINGS:

FIG. 1 is a schematic side elevational view of a known heated tool used for connecting two object to each other;

FIG. 2 is a view similar to FIG. 1 showing a first embodiment of the present invention;

FIG. 3 is a view similar to FIG. 2 showing a modified form of the first embodiment;

FIG. 4 is a side elevational view of a second embodiment of the present invention using two heated tools in conjunction with each other;

FIG. 5a is a schematic perspective view of the first embodiment of the invention, illustrating additional components which may be utilized;

FIG. 5b is a schematic side elevational view of a third embodiment of the invention;

FIG. 6 is a view similar to FIG. 5b showing a modified version of the third embodiment;

FIG. 7 is a view similar to FIG. 6 showing a further modified version of the third embodiment; and FIG. 8 is a perspective view showing a fourth embodiment of the invention.

DESCRIPTION OF THE PREFERRED EMBODIMENTS

Referring to the drawings in particular, the invention embodied in FIG. 2 comprises a heated tool 1 which has heating surfaces which are preferably heated by passing electric current through the tool. Although less desirable, hot gases or other heating mechanisms may be used for heating the surfaces of the heated tool 1.

Tool 1 includes a basic or main heat supplying surface 11 which, in a usual manner, can be applied with pressure in the direction of arrow 2 against a component lead or first object 3 and into engagement with a second object 4 supported on an substrate. In accordance with the present invention, an additional second heating surface 9 is provided on a projection of the tool 1, which is offset in respect to the first heating surface 11. The offset between heating surfaces 9 and 11 is advantageously equal to or greater than the width of the object 3 so that heating surfaces 9 and 11 simultaneously contact objects 4 and 3 respectively. This efficiently transfers heat to both objects at substantially the same time and under substantially the same thermal conditions. This permits heating surface 11 to be set at a lower temperature than would otherwise be the case. A slot or gap 14 is advantageously provided between surfaces 9 and 11.

In accordance with the embodiment of FIG. 2, the transfer of heat is almost simultaneous for objects 3 and 4 using the single applied force in the direction of arrow 2. Rather than being heated only by heat passing from tool 1 through object 3, object 4 is directly heated at area 10 by the second heating surface 9. Slot or gap 14 advantageously provides room for any excess flowing solder and, as will be explained later in connection with other embodiments of the invention, can be utilized to help control the flow of solder across the objects to be connected to each other.

FIG. 3 which utilizes the same numerals to designate the same or similar parts, shows a modified form of the first embodiment wherein the offset between the first and second heating surfaces 11 and 9 is greater than the width of the first object 3. This provides a gap between the heating surface 11, the first object 3 and a second object 4 which can be filled with solder 13. This allows for a wider tolerance in the solder layer 13 and avoids the direct application of force on the object 3 by the heating surface 11.

FIG. 4 illustrates a combination of two inventive tools having first heating surfaces 11 and 18 and second offset heating surfaces 9 and 16 respectively. This increases the thermal heat flow to facing metallized or solder surfaces 7 of two objects to be connected together. This embodiment is particularly useful where the metallized layer 7 is applied to an insulated base material 17 to form a flexible board.

FIG. 5a illustrates a typical use for a simplified tool made in accordance with the present invention. An auxiliary heated tool 19 is in contact with a lower surface of the first object 3 for heating that object from below. Tool 1 having a first heating surface 11 is brought into direct thermal contact with the upper surface of object 3 under force. This simultaneously heats upper and lower surfaces of object 3. The auxiliary heated tool 19 is advantageously in the form of a U and is disposed beyond the end of the second object 4 to which the first object 3 is to be connected.

The heater tool 1 also included a second heating area 9 which supplies additional thermal energy directly to the metallized surface of second object 4 close to the heating area 11. A mechanical support 20 is provided as a separate mechanical unit for supporting the second object 4, and for supplying additional thermal energy thereto. The temperature of the mechanical support 20 can be set much lower than for the heated tools 1 or 9 since the support 20 is provided primarily to reduce thermal loading through object 4.

FIG. 5b illustrates an additional improvement of the present invention which can be used for thermal heat flow control. Two separate heated tools 21 and 22 are utilized for applying thermal energy and force to the objects 3 and 4. Tool 21 includes a heating surface 25 which is similar to that found in the tool of FIG. 1. Tool 22 has at least two separate heating areas. Offset heating areas 26 and 27 simultaneously supply heat to the respective objects 3 and 4. An incline heating area 28 is provided between the offset heating areas 26 and 27. The presence of this incline area improves thermal contact with solder 29 which is melted and flows between and among the objects 3 and 4.

Tool 22 can be set at a higher or lower temperature than tool 21. This allows solder 29 to flow more easily in the direction of arrow 30 and allow an easier thermal connection between objects 3 and 4.

Solder can be seen in FIG. 5b to flow up beyond the ends of tool 21 and 22 and in the gap between the tools. This improves the free flow of solder.

FIG. 6 illustrates a modified version of the embodiment shown in FIG. 5b. Tool 22 is only in thermal contact at its heating surface 27 with the object 4 and is supplied with a much higher thermal energy so as to compensate for thermal loads of the object 4. Object 3 is simultaneously heated by heated tool 21 at its heating surface 25. A heating and pressure control unit 38 is schematically illustrated in FIG. 6 for applying pressure and an electric current to the tools 21 and 22. This unit can advantageously supply different levels of pressure and different levels of thermal energy to the tools which are separated by a gap. The timing cycles for heating of the two tools can also be different For example tool 22 can be activated first to preheat the object 4 before tool 21 is activated to heat and connect together the objects 3 and 4.

FIG. 7 illustrates a modified form of the embodiment of FIG. 6. The tool for heating object 4 is provided with an additional inclined heating area 31 which is similar to the heating area 28 in the embodiment of FIB. 5b. This area has the effect of melting and moving solder 32 in the gap between the tools in the direction of arrow 33 toward the object 3, if the temperature conditions between tools 22 and 21 are set properly. Here again the tools 21 and 22 can be provided with different force, heating energy and timing cycles.

FIG. 8 illustrates an embodiment of the invention wherein the tool 34 is U-shaped and has a web 37 between legs of the tool which has a lower heating surface 35 provided with a pair of cutouts or recesses 36. Recesses 36 are shaped to accommodate leads of a package to be soldered to a printed circuit board. Recesses 36 cover toes or ends of the leads (not shown) while the heating area 35 transfers thermal energy to the printed circuit board.

This design provides the fastest heat transfer at the lowest time, is easier to handle and is of low cost. A small amount of mechanical freedom can be provided between the leads and the pads to allow for a layer of solder, by making the recesses 36 deeper than the thickness of the leads.

While the specific embodiments of the invention have been shown and described in detail to illustrate the application of the principles of the invention, it will be understood that the invention may be embodied otherwise without departing from such principles.

What is claimed is:

1. An apparatus for heating two objects including a first object having a thickness and an end, and being engaged against a second object, the apparatus comprising:
    a support for supporting the second object on a side thereof opposite from the first object; and
    a heated tool having a first heating surface for engaging the first object on a side thereof opposite from the second object, and a second heating surface which is offset from the first heating surface by at least the thickness of the first object, for directly engaging and heating the second object, with a slot in said heated tool between said first and second heating surfaces.

2. An apparatus according to claim 1 wherein said first and second heating surfaces lie in parallel planes which are offset from each other.

3. An apparatus according to claim 1 wherein said heated tool includes an inclined heating surface between said first and second heating surfaces.

4. An apparatus for heating two objects including a first object having a thickness and an end, and being engaged against a second object, the apparatus comprising:
    a support for supporting the second object on a side thereof opposite from the first object; and
    a heated tool having a first heating surface for engaging the first object on a side thereof opposite from the second object, and a second heating surface which is offset from the first heating surface by at least the thickness of the first object, for directly engaging and heating the second object,
    said heated tool comprising a first tool member carrying said first heating surface and a second tool member spaced away from said first tool member by a gap and carrying said second heating surface.

5. An apparatus according to claim 4 wherein said second tool member includes an inclined heating surface adjacent said second heating surface.

6. An apparatus according to claim 4 wherein said second tool member includes a further heating surface which is coplanar with said first heating surface for engaging and heating the first object, and an inclined heating surface between said further heating surface and said second heating surface for extending beyond the end of the first object.

7. An apparatus according to claim 4 including heating and pressure control means connected to said first and second tool members for applying different pressures and different energy to said first and second tool members.

8. An apparatus for heating two objects including a first object having a thickness and an end, and being engaged against a second object, the apparatus comprising:
    a support for supporting the second object on a side thereof opposite from the first object; and
    a heated tool having a first heating surface for engaging the first object on a side thereof opposite from the second object, and a second heating surface which is offset from the first heating surface by at least the thickness of the first object, for directly engaging and heating the second object; and
    an auxiliary heated tool for engaging a surface of the first object which is opposite from said first heating surface, said auxiliary heated tool having an auxiliary heating surface for engaging and heating the first object.

9. An apparatus according to claim 8 wherein said support comprises said auxiliary heated tool and includes a second heated tool having first and second offset heating surfaces for engaging respective surfaces of the second and first objects.

10. An apparatus according to claim 8 wherein said support is spaced away from said auxiliary heated tool for engagement of the second object only in the area under said second heating surface.

11. An apparatus for heating two objects including a first object having a thickness and an end, and being engaged against a second object, the apparatus comprising:
    a support for supporting the second object on a side thereof opposite from the first object; and
    a heated tool having a first heating surface for engaging the first object on a side thereof opposite from the second object, and a second heating surface which is offset from the first heating surface by at least the thickness of the first object, for directly engaging and heating the second object, said first heating surface being provided on a recess in said second heating surface.

12. An apparatus according to claim 11 wherein said heated tool is U-shaped and includes a web for carrying said first and second heating surfaces.

13. A heating tool having a first heating surface for engaging and heating a first object, and a second heating surface offset from said first heating surface by at least the thickness of the first object, for engaging and heating a second object which is engaged against the first object, with a slot between said first and second heating surfaces.

14. A tool according to claim 13 including an inclined heating surface between said first and second heating surfaces.

15. A heating tool having a first heating surface for engaging and heating a first object, and a second heating surface offset from said first heating surface by at least the thickness of the first object, for engaging and heating a second object which is engaged against the first object, with an inclined heating surface between said first and second heating surfaces and a gap between said first and second heating surfaces.

* * * * *